(12) United States Patent
Susanto et al.

(10) Patent No.: US 10,120,406 B1
(45) Date of Patent: Nov. 6, 2018

(54) ADAPTIVE COMMON MODE DIMMER

(71) Applicant: Microchip Technology Incorporated, Chandler, AZ (US)

(72) Inventors: Tony Susanto, Austin, TX (US); Maarten Kuijk, Antwerp (BE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/901,530

(22) Filed: Feb. 21, 2018

Related U.S. Application Data

(60) Provisional application No. 62/491,049, filed on Apr. 27, 2017.

(51) Int. Cl.
| | | |
|---|---|---|
| *H04L 7/00* | (2006.01) | |
| *H04B 3/28* | (2006.01) | |
| *H03K 17/16* | (2006.01) | |
| *G05F 3/26* | (2006.01) | |
| *H04L 25/02* | (2006.01) | |
| *H04L 25/08* | (2006.01) | |
| *H04B 3/50* | (2006.01) | |
| *H04B 1/58* | (2006.01) | |
| *H03K 19/0185* | (2006.01) | |

(52) U.S. Cl.
CPC ........... *G05F 3/262* (2013.01); *H03K 17/162* (2013.01); *H03K 19/018564* (2013.01); *H04B 1/58* (2013.01); *H04B 3/28* (2013.01); *H04B 3/50* (2013.01); *H04L 7/0087* (2013.01); *H04L 25/028* (2013.01); *H04L 25/085* (2013.01)

(58) Field of Classification Search
CPC ... H04L 25/0278; H04L 25/08; H04L 25/085; H04L 25/0282; H04L 25/0272; H04L 7/00; H04B 1/0475; H04B 3/28; H04B 3/30; H04B 3/50; H03K 19/018564; H03K 17/04106; H03K 19/018528; H01P 5/085
See application file for complete search history.

(56) References Cited

U.S. PATENT DOCUMENTS

| | | | |
|---|---|---|---|
| 7,190,188 B2 * | 3/2007 | Otsuka | H04L 25/08 326/30 |
| 7,505,752 B1 * | 3/2009 | Andrews | H04L 25/0264 455/130 |
| 7,724,043 B1 | 5/2010 | Leboeuf, II et al. | 327/91 |

(Continued)

OTHER PUBLICATIONS

International Search Report and Written Opinion, Application No. PCT/US2018/029365, 11 pages, dated Jul. 30, 2018.

*Primary Examiner* — Vibol Tan
(74) *Attorney, Agent, or Firm* — Slayden Grubert Beard PLLC (57) ABSTRACT

An adaptive mode has been added in a common mode (CM) dimmer circuit to increase output current capability only when needed. Without having an adaptive mode in the CM dimmer, the output current drivers must operate with large quiescent current to handle a bulk current injection (BCI) event. Therefore, a CM dimmer without the adaptive mode will consume a significant amount of power even when there is no BCI event occurring. With the adaptive mode, the CM dimmer can be used effectively to suppress the BCI event, e.g., in a transformer-less physical layer (PHY) connection, while consuming minimal power during normal circuit operation.

20 Claims, 4 Drawing Sheets

(56) References Cited

U.S. PATENT DOCUMENTS

| | | | |
|---|---|---|---|
| 8,164,358 B2* | 4/2012 | Van Den Brande | H03K 17/162 326/30 |
| 8,488,685 B2* | 7/2013 | Maillard | H04B 1/58 375/257 |
| 8,891,595 B1* | 11/2014 | Farjadrad | H04L 12/10 375/219 |
| 9,473,205 B2* | 10/2016 | Ivanov | H01P 1/268 |
| 9,866,270 B2* | 1/2018 | Ivanov | H04B 3/28 |
| 9,882,702 B2* | 1/2018 | Devuyst | H04L 5/1407 |
| 2008/0024178 A1 | 1/2008 | Kim et al. | 327/108 |
| 2008/0211427 A1* | 9/2008 | Budde | H05B 37/0272 315/294 |
| 2012/0026761 A1 | 2/2012 | Young | 363/44 |

* cited by examiner

ADAPTIVE COMMON MODE DIMMER

RELATED PATENT APPLICATION

This application claims priority to commonly owned U.S. Provisional Patent Application No. 62/491,049; filed Apr. 27, 2017; which is hereby incorporated by reference herein for all purposes.

TECHNICAL FIELD

The present disclosure relates to power technology and, in particular, to an adaptive common mode dimmer.

BACKGROUND

Common-mode (CM) currents may be caused by a bulk current injection (BCI) event by capacitive coupling from a noise source, electromagnetic interference (EMI), and/or magnetic coupling. CM currents can cause cables to act as unintentional radiators/receptors in electrical systems. CM radiation has been shown to be proportional to cable length and signal frequency. Reduction of CM radiation generally requires minimizing the CM current or CM signal frequency. A way to reduce CM current is to use CM dimmer circuit(s) coupled to differential drivers and receivers communicating over a two-wire differential signal transmission line. This requires differential driver circuits in the CM dimmer circuit having sufficient drive/sink current capacity to overcome BCI events. However, to guarantee sufficient drive/sink current capacity the CM dimmer differential driver circuits must operate at a high quiescent current. This is a significant power drain for the overall system.

SUMMARY

Hence, there is a need for a CM dimmer circuit having lower power consumption during normal operation when no BCI events are occurring but be able to handle high current CM BCI events when they do occur.

According to an embodiment, an adaptive common mode dimmer may comprise: a common mode dimmer having a low operating quiescent current first mode and a higher operating quiescent current second mode; and the common mode dimmer may be adapted for coupling to a two-wire transmission line and maintaining a common mode voltage thereon at a desired common mode reference voltage, wherein the two-wire transmission line may carry differential signals; wherein the common mode dimmer may be in the first mode when the common mode voltage on the two-wire transmission line may be between a high common mode reference voltage and a low common mode reference voltage, and may be in the second mode otherwise.

According to a further embodiment, the high common mode reference voltage is less than a power supply voltage; the desired common mode reference voltage is less than the high common mode reference voltage; and the low common mode reference voltage is less than the desired common mode reference voltage and greater than a ground or power supply common. According to a further embodiment, the desired common mode reference voltage may be about one-half of a power supply voltage. According to a further embodiment, a bulk current injection (BCI) event may cause the common mode voltage to be above the high common mode reference voltage or may be below the low common mode reference voltage, wherein the common mode dimmer may be in the second mode. According to a further embodiment, the common mode dimmer may cause the common mode voltage to return to between the high and low common mode reference voltages before changing from the second mode to the first mode.

According to a further embodiment, when the common mode voltage may be above the desired common mode reference voltage the common mode dimmer may sink current from the two-wire transmission line to a ground or power supply common. According to a further embodiment, when the common mode voltage may be below the desired common mode reference voltage the common mode dimmer may source current to the two-wire transmission line from the power supply voltage. According to a further embodiment, the BCI event may cause at least 200 milliamperes of common mode current on the two-wire transmission line and the common mode dimmer may be in the second mode when the common mode voltage may be greater than the high common mode reference voltage or less than the low common mode reference voltage.

According to another embodiment, a method for reducing common mode voltage on a differential signal transmission line by using an adaptive common mode dimmer having low and high operating quiescent current modes may comprise the steps of: providing a common mode dimmer having a low operating quiescent current first mode and a higher operating quiescent current second mode; coupling the common mode dimmer to a two-wire transmission line for maintaining a common mode voltage thereon at a desired common mode reference voltage, wherein the two-wire transmission line carries differential signals; operating the common mode dimmer in the first mode when the common mode voltage on the two-wire transmission line may be between a high common mode reference voltage and a low common mode reference voltage; and operating the common mode dimmer in the second mode when the common mode voltage on the two-wire transmission line may be greater than the high common mode reference voltage or lower than the low common mode reference voltage.

According to a further embodiment of the method, the high common mode reference voltage may be less than a power supply voltage; the desired common mode reference voltage may be less than the high common mode reference voltage; and the low common mode reference voltage may be less than the desired common mode reference voltage and greater than a ground or power supply common. According to a further embodiment of the method, the desired common mode reference voltage may be about one-half of the power supply voltage. According to a further embodiment of the method, may comprise the step of causing the common mode dimmer to be in the second mode during a bulk current injection (BCI) event when the common mode voltage may be above the high common mode reference voltage or below the low common mode reference voltage. According to a further embodiment of the method, may comprise the step of returning the common mode voltage to between the high and low common mode reference voltages when the common mode dimmer may be in the second mode. According to a further embodiment of the method, may comprise the step of sinking current from the two-wire transmission line to ground or power supply common when the common mode voltage may be above the desired common mode reference voltage. According to a further embodiment of the method, may comprise the step of sourcing current to the two-wire transmission line from a power supply voltage when the common mode voltage may be below the desired common mode reference voltage.

According to yet another embodiment, a system for transmission of signals over a differential transmission line and having adaptive common mode dimmers with low and high operating quiescent current modes may comprise: a differential signal transmitter having a first adaptive common mode dimmer coupled thereto; a differential signal receiver having a second adaptive common mode dimmer coupled thereto; and a differential signal transmission line coupling the differential signal transmitter and the differential signal receiver; the first and second adaptive common mode dimmers each have a low operating quiescent current first mode and a higher operating quiescent current second mode; wherein the first and second adaptive common mode dimmers may be in the first mode when a common mode voltage on the two-wire transmission line may be between a high common mode reference voltage and a low common mode reference voltage, and may be in the second mode otherwise.

According to still another embodiment, an adaptive common mode dimmer may comprise: a first set of current drivers coupled between a power supply voltage and a two-wire transmission line; a second set of current drivers coupled between a ground or power supply common and the two-wire transmission line; first and second voltage comparators having outputs coupled to and controlling the first and second sets of current drivers, respectively, first inputs coupled to the two-wire transmission line, and second inputs coupled to a first reference voltage, wherein the first reference voltage may be less than the power supply voltage and greater than the ground or power supply common; wherein when a common mode voltage on the two-wire transmission line may be greater than the first reference voltage the second set of current drivers will sink more current than the first set of current drivers will source, and when the common mode voltage on the two-wire transmission line may be less than the first reference voltage the first set of current drivers will source more current than the second set of current drivers will sink; a third voltage comparator having a first input coupled to a second reference voltage, a second input coupled to the two-wire transmission line, and an output coupled to the second set of current drivers for increasing their operating quiescent current when the common mode voltage may be greater than the second reference voltage, wherein the second reference voltage may be greater than the first reference voltage; and a fourth voltage comparator having a first input coupled to a third reference voltage, a second input coupled to the two-wire transmission line, and an output coupled to the first set of current drivers for increasing their operating quiescent current when the common mode voltage may be less than the third reference voltage, wherein the third reference voltage may be less than the first reference voltage.

According to a further embodiment, the first reference voltage may be about one-half the power supply voltage. According to a further embodiment, a first buffer transistor may be between the output of the fourth voltage comparator and the first set of current drivers. According to a further embodiment, a second buffer transistor may be between the output of the third voltage comparator and the second set of current drivers.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

An adaptive mode has been added in a common mode (CM) dimmer circuit to increase output current capability only when needed. Without having an adaptive mode in the CM dimmer, the output current drivers must operate with large quiescent current to handle a bulk current injection (BCI) event. Therefore, a CM dimmer without the adaptive mode will consume a significant amount of power even when there is no BCI event occurring. With the adaptive mode, the CM dimmer can be used effectively to suppress the BCI event, e.g., in a transformer-less physical layer (PHY) connection, while consuming minimal power during normal circuit operation.

Referring now to the drawings, the details of example embodiments are schematically illustrated. Like elements in the drawings will be represented by like numbers, and similar elements will be represented by like numbers with a different lower-case letter suffix.

Figure 1:
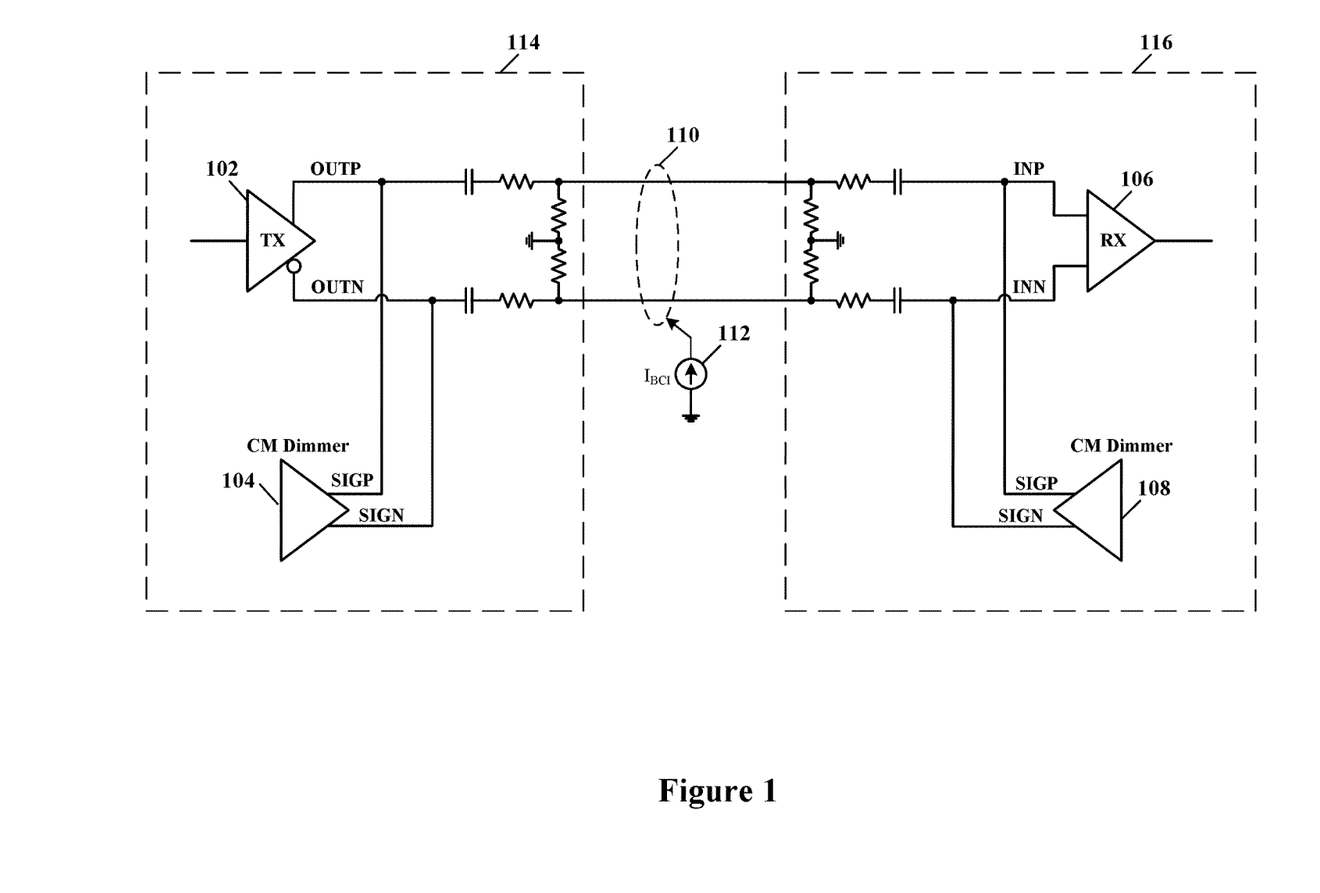
FIG. 1 illustrates a schematic block diagram of a differential transmitter and receiver pair each having common mode dimmers coupled thereto, according to the teachings of this disclosure.

Referring to FIG. 1, depicted is a schematic block diagram of a differential transmitter and receiver pair each having common mode dimmers coupled thereto, according to the teachings of this disclosure. FIG. 1 shows a simplified typical connection between a transmitter 114 having a differential output and a receiver 116 having a differential input, with each having a common mode (CM) dimmer circuit 104, 108 coupled thereto respectively. The electrical signal connection between the differential transmitter 114 and differential receiver 116 may be with a pair of wires forming a transmission line 110, e.g., unshielded twisted pair (UTP) wires or coaxial (shielded) cables.

Common mode current $I_{BCI}$ (represented by a current source 112) from any external interference may be injected through capacitive coupling, electromagnetic interference and/or magnetically induced onto the transmission line 110. This phenomenon is commonly called "Bulk Current Injection" (BCI). During this BCI event, the common mode voltage (voltage between wires and ground of the differentially connected pair of wires (OUTP, OUTN, INP, INN) forming the transmission line 110) will increase when the injected CM current $I_{BCI}$ is positive and decrease when it is negative. The CM dimmer circuits 104, 108 will then source or sink currents onto the differentially connected pair of wires 110 to counteract the externally induced common mode current $I_{BCI}$ from a BCI event.

Figure 4:
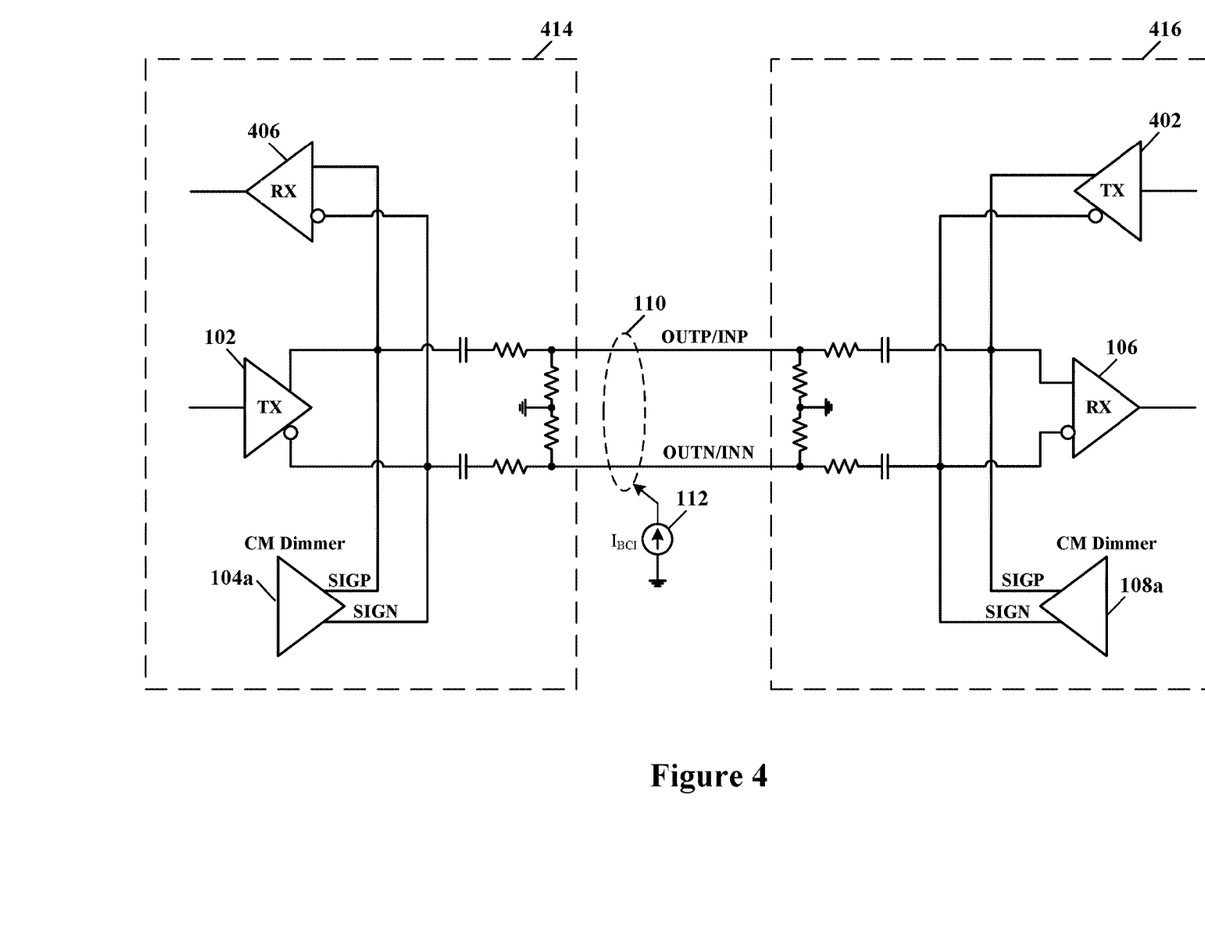
FIG. 4 illustrates a schematic block diagram of a differential transceiver pair each having common mode dimmers coupled thereto, according to the teachings of this disclosure.

Referring to FIG. 4, depicted is a schematic block diagram of a differential transceiver pair each having common mode dimmers coupled thereto, according to the teachings of this disclosure. Transceivers 414 and 416 are coupled together with and communicate over a differential transmission line 110. Operation of the Transceivers 414 and 416 are functionally the same as the differential transmitter 102 and receiver 106 pair shown in FIG. 1 but capable of communicating in a half-duplex mode. For a full duplex mode of communications, a second differential transmission line may be provided (not shown) and coupled directly between the receiver 406 and transmitter 402, however in this configuration additional CM dimmers would have to be provided for and coupled to the second differential transmission line.

Figure 2:
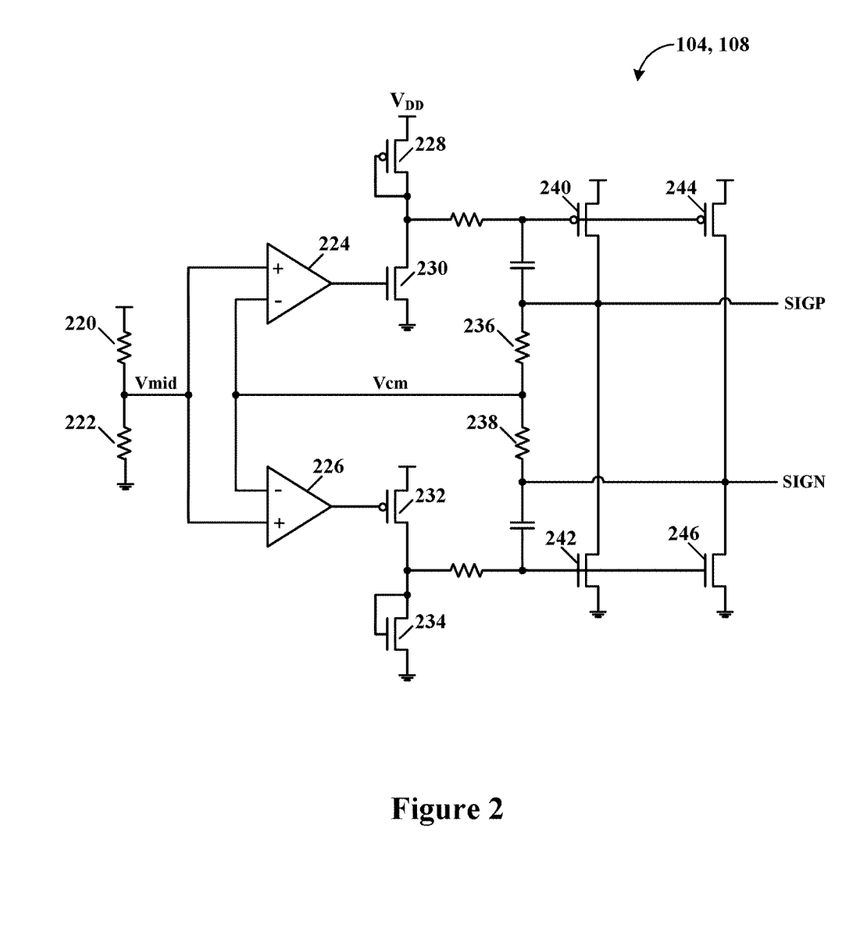
FIG. 2 illustrates a schematic diagram of a common mode dimmer, according to the teachings of this disclosure.

Referring to FIG. 2, depicted is a schematic diagram of a common mode dimmer, according to the teachings of this disclosure. Each of the CM dimmer circuits 104, 108 may comprise voltage comparators 224, 226; resistors 220, 222, 236, 238; and transistors 228, 230, 232, 234, 240, 242, 244, 246. Additional resistors and capacitors not numbered are not relevant to the discussion herein but have been included for circuit completeness. The CM dimmer circuit 104, 108 shown in FIG. 2 measures the common mode voltage, Vcm, of a differential signal pair SIGP, SIGN and adjusts it to be substantially the same as a common mode voltage reference, Vmid (Vmid=$V_{DD}$/2, the values of resistors 220 and 222 are the same). The CM dimmer circuit 104, 108 increases or decreases the gate voltages and thus the currents of the transistors 240 and 242 (similarly transistors 244 and 246) through the comparators 224 and 226, and the mirror transistors 228 and 234. When Vcm is greater than Vmid, comparator 224 turns off transistor 230 and comparator 226 turns on transistor 232. When Vcm is less than Vmid, comparator 224 turns on transistor 230 and comparator 226 turns off transistor 232. For example, when Vcm is higher than Vmid, the comparators 224 and 226 will increase the gate voltages of transistors 228 and 234. Because of this current mirroring, transistors 240 and 244 will source less current, and transistors 242 and 246 will sink more current, and consequently, the common mode voltage Vcm will be reduced through this feedback operation.

The amount of CM current caused by a BCI event can be very large, thus transistors 240, 242, 244, 246 are designed to source and sink some of the CM current caused by the BCI event that may generate hundreds of milliamperes of CM current. To source and sink this much CM current these transistors 240, 242, 244, 246 must operate (be biased) at a high quiescent current. However, during normal operation, when a BCI event is not occurring, a reduction of quiescent current is desired to minimize circuit power consumption while keeping the transistors 240, 242, 244, 246 in their saturation region (hard ON) when appropriate.

For example, for the transistors 240, 242, 244, 246 to have 200 milliampere CM current capabilities during a BCI event, and assuming a 20 times current ratio, the circuit for the transistors 228 and 234 may be designed to conduct a maximum of 10 milliamperes. Under normal operation, however, the transistors 228 and 234 will consume approximately half of this maximum current, or 5 milliampere, which means that the transistors 240, 242, 244, 246 will have a quiescent current of 100 milliamperes. 100 milliamperes is an enormous power consumption for just one CM dimmer circuit, and considering that a plurality of CM dimmers will be used in a data transmission system a large power consumption penalty is created.

Figure 3:
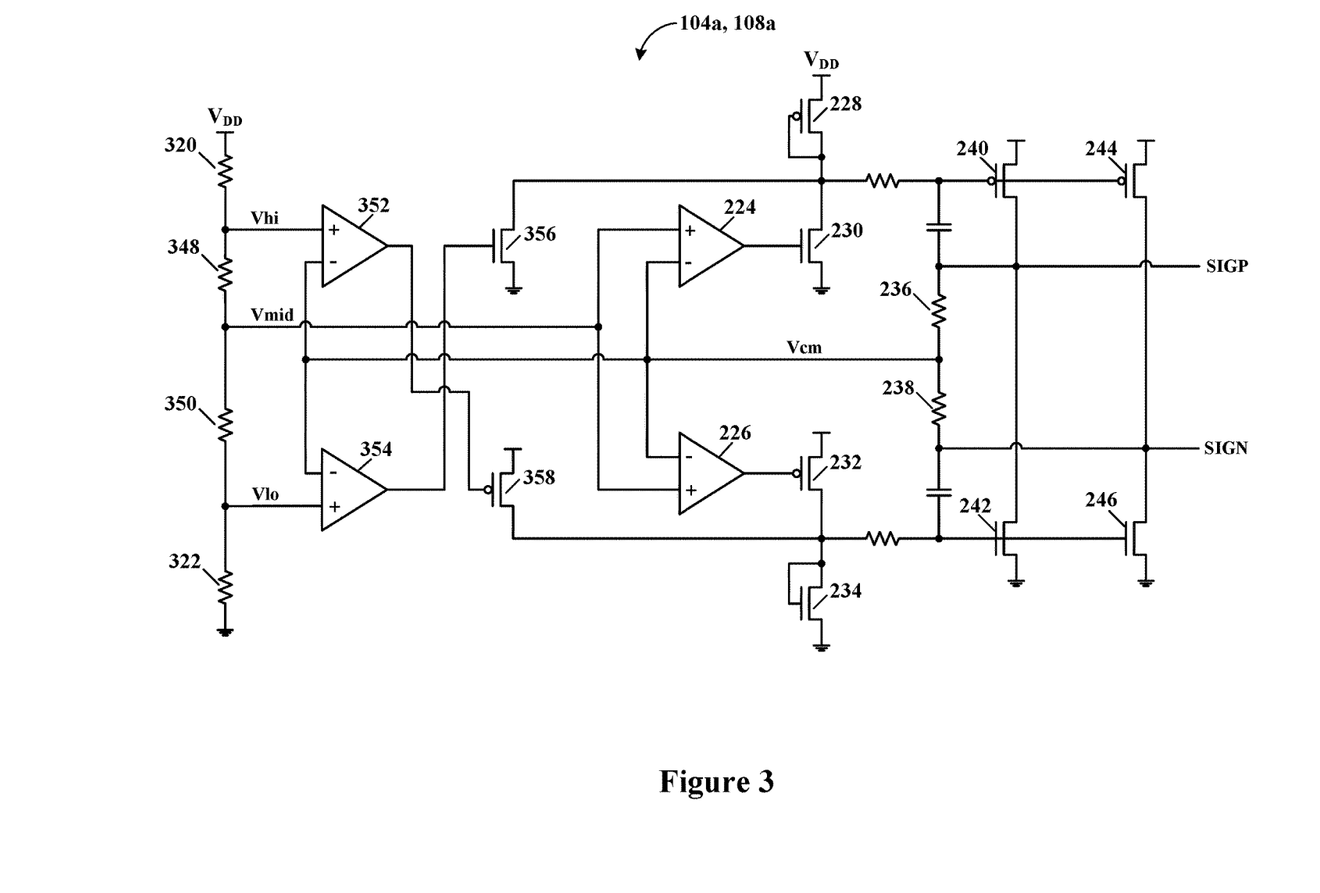
FIG. 3 illustrates a schematic diagram of an adaptive common mode dimmer, according to a specific example embodiment of this disclosure.

Referring to FIG. 3, depicted is a schematic diagram of an adaptive common mode dimmer, according to a specific example embodiment of this disclosure. The CM dimmers 104a, 108a comprise similar circuitry to the CM dimmers 104, 108 shown in FIG. 2 with the addition of resistors 320, 348, 350 and 322; voltage comparators 352 and 354, and transistors 356 and 358. The resistors 320, 348, 350 and 322 are configured as a resistance ladder network to provide reference voltages Vhi, Vmid and Vlo, where Vhi>Vmid>Vlo. The CM dimmers 104a, 108a shown in FIG. 3 provide both lower power consumption under normal operating conditions and high current capacity during a BCI event.

Comparators 352, 354 and transistors 356, 358 provide additional currents on the transistors 228, 234 only when the common mode voltage Vcm is higher or lower than Vhi or Vlo, respectively. Under normal operation, without a BCI event occurring, transistors 228 and 234 consume very little current which are then replicated by the transistors 240, 244, 242 and 246. But when a BCI event occurs, the common mode voltage Vcm could be higher than Vhi or lower than Vlo depending upon the amount of the current injected into the SIGP and SIGN signal lines. When this occurs, transistors 228 and 234 and therefore transistors 240, 244, 242 and 246 will source and sink more current due to the additional voltage comparators 352 and 354, and the transistors 356 and 358.

Referring to the previous examples, preferably transistors 228 and 234 will have a maximum current of 10 milliamperes, whereby with a 20× current ratio, transistors 240, 244, 242 and 246 will be able to handle a 200 milliampere BCI event. For illustration purposes but without limitation, the maximum current flowing through transistors 230 and 356 can be divided into one (1) milliampere and nine (9) milliamperes, respectively. In normal operation, the voltage Vcm will be close to Vmid, therefore, the comparators 352 and 354 will be turned off. Thus, no current will be flowing through the transistors 356 and 358. The current flowing through transistors 230 and 232 will be approximately 0.5 milliampere which is the same amount of current flowing through transistors 228 and 234. There, the quiescent current flowing through transistors 240 and 242 will be approximately 10 milliamperes, a significant savings of power during normal operation.

The adaptive mode performed by the voltage comparators 352 and 354 in combination with the transistors 356 and 358 may be used to increase the output current capability only when it is needed, e.g., during a BCI event. Without the voltage comparators 352 and 354 and the transistors 356 and 358, the output current drivers, implemented by the transistors 240, 244, 242 and 246 would have to operate at a large quiescent current all the time in order to handle a BCI event.

What we claim:

1. An adaptive common mode dimmer, comprising:
a common mode dimmer having a low operating quiescent current first mode and a higher operating quiescent current second mode; and
the common mode dimmer is adapted for coupling to a two-wire transmission line and maintaining a common mode voltage thereon at a desired common mode reference voltage, wherein the common mode dimmer comprises two comparators defining a reference voltage window and wherein the two-wire transmission line carries differential signals;
wherein the common mode dimmer is in the first mode when the common mode voltage on the two-wire transmission line is within the reference voltage window between a high common mode reference voltage and a low common mode reference voltage, and is in the second mode otherwise.

2. The adaptive common mode dimmer according to claim 1, wherein:
the high common mode reference voltage is less than a power supply voltage;
the desired common mode reference voltage is less than the high common mode reference voltage; and
the low common mode reference voltage is less than the desired common mode reference voltage and greater than a ground or power supply common.

3. The adaptive common mode dimmer according to claim 2, wherein the desired common mode reference voltage is about one-half of the power supply voltage.

4. The adaptive common mode dimmer according to claim 1, wherein a bulk current injection (BCI) event causes the common mode voltage to be above the high common mode reference voltage or below the low common mode reference voltage, wherein the common mode dimmer is in the second mode.

5. The adaptive common mode dimmer according to claim 4, wherein the BCI event causes at least 200 milli-amperes of common mode current on the two-wire transmission line and the common mode dimmer is in the second mode when the common mode voltage is greater than the high common mode reference voltage or less than the low common mode reference voltage.

6. The adaptive common mode dimmer according to claim 1, wherein the common mode dimmer causes the common mode voltage to return to between the high and low common mode reference voltages before changing from the second mode to the first mode.

7. The adaptive common mode dimmer according to claim 1, wherein when the common mode voltage is above the desired common mode reference voltage the common mode dimmer sinks current from the two-wire transmission line to a ground or power supply common.

8. The adaptive common mode dimmer according to claim 1, wherein when the common mode voltage is below the desired common mode reference voltage the common mode dimmer sources current to the two-wire transmission line from the power supply voltage.

9. A method for reducing common mode voltage on a differential signal transmission line by using an adaptive common mode dimmer having low and high operating quiescent current modes, said method comprising the steps of:
providing a common mode dimmer having a low operating quiescent current first mode and a higher operating quiescent current second mode and comprising a first and second comparator defining a reference voltage window;
coupling the common mode dimmer to a two-wire transmission line for maintaining a common mode voltage thereon at a desired common mode reference voltage, wherein the two-wire transmission line carries differential signals;
operating the common mode dimmer in the first mode when the common mode voltage on the two-wire transmission line is within the reference voltage window between a high common mode reference voltage and a low common mode reference voltage; and
operating the common mode dimmer in the second mode when the common mode voltage on the two-wire transmission line is greater than the high common mode reference voltage or lower than the low common mode reference voltage.

10. The method according to claim 9, wherein:
the high common mode reference voltage is less than a power supply voltage;
the desired common mode reference voltage is less than the high common mode reference voltage; and
the low common mode reference voltage is less than the desired common mode reference voltage and greater than a ground or power supply common.

11. The method according to claim 10, wherein the desired common mode reference voltage is about one-half of the power supply voltage.

12. The method according to claim 9, comprises the step of causing the common mode dimmer to be in the second mode during a bulk current injection (BCI) event when the common mode voltage is above the high common mode reference voltage or below the low common mode reference voltage.

13. The method according to claim 9, comprises the step of returning the common mode voltage to between the high and low common mode reference voltages when the common mode dimmer is in the second mode.

14. The method according to claim 9, comprises the step of sinking current from the two-wire transmission line to ground or power supply common when the common mode voltage is above the desired common mode reference voltage.

15. The method according to claim 9, comprises the step of sourcing current to the two-wire transmission line from a power supply voltage when the common mode voltage is below the desired common mode reference voltage.

16. A system for transmission of signals over a differential transmission line and having adaptive common mode dimmers with low and high operating quiescent current modes, said system comprising:
a differential signal transmitter having a first adaptive common mode dimmer coupled thereto;
a differential signal receiver having a second adaptive common mode dimmer coupled thereto; and
a differential signal transmission line coupling the differential signal transmitter and the differential signal receiver;
the first and second adaptive common mode dimmers each comprise two comparators defining a reference voltage window and each have a low operating quiescent current first mode and a higher operating quiescent current second mode;
wherein the first and second adaptive common mode dimmers are in the first mode when a common mode voltage on the two-wire transmission line is within the reference voltage window between a high common mode reference voltage and a low common mode reference voltage, and are in the second mode otherwise.

17. An adaptive common mode dimmer, comprising:
a first set of current drivers coupled between a power supply voltage and a two-wire transmission line;
a second set of current drivers coupled between a ground or power supply common and the two-wire transmission line;
first and second voltage comparators having outputs coupled to and controlling the first and second sets of current drivers, respectively, first inputs coupled to the two-wire transmission line, and second inputs coupled to a first reference voltage, wherein the first reference voltage is less than the power supply voltage and greater than the ground or power supply common;
wherein when a common mode voltage on the two-wire transmission line is greater than the first reference voltage the second set of current drivers will sink more current than the first set of current drivers will source, and when the common mode voltage on the two-wire transmission line is less than the first reference voltage the first set of current drivers will source more current than the second set of current drivers will sink;

a third voltage comparator having a first input coupled to a second reference voltage, a second input coupled to the two-wire transmission line, and an output coupled to the second set of current drivers for increasing their operating quiescent current when the common mode voltage is greater than the second reference voltage, wherein the second reference voltage is greater than the first reference voltage; and a fourth voltage comparator having a first input coupled to a third reference voltage, a second input coupled to the two-wire transmission line, and an output coupled to the first set of current drivers for increasing their operating quiescent current when the common mode voltage is less than the third reference voltage, wherein the third reference voltage is less than the first reference voltage.

18. The adaptive common mode dimmer according to claim 17, wherein the first reference voltage is about one-half the power supply voltage.

19. The adaptive common mode dimmer according to claim 17, further comprising a first buffer transistor between the output of the fourth voltage comparator and the first set of current drivers.

20. The adaptive common mode dimmer according to claim 17, further comprising a second buffer transistor between the output of the third voltage comparator and the second set of current drivers.

* * * * *